United States Patent [19]

Kasperkovitz

[11] Patent Number: 4,970,469
[45] Date of Patent: Nov. 13, 1990

[54] PHASE DETECTOR AND FREQUENCY DEMODULATOR INCLUDING SUCH A PHASE DETECTOR

[75] Inventor: Wolfdietrich G. Kasperkovitz, Eindhoven, Netherlands

[73] Assignee: U.S. Philips Corp., New York, N.Y.

[21] Appl. No.: 411,795

[22] Filed: Sep. 25, 1989

[30] Foreign Application Priority Data

Oct. 14, 1988 [NL] Netherlands .................. 8802531

[51] Int. Cl.$^5$ .................................. H03D 3/06
[52] U.S. Cl. .................................. 329/325; 329/336
[58] Field of Search ............ 329/323, 325, 336, 337, 329/360; 307/525; 328/133

[56] References Cited

U.S. PATENT DOCUMENTS 4,339,726  7/1982  Miura .................. 329/337

FOREIGN PATENT DOCUMENTS 0122657 10/1984 European Pat. Off. .
2151093  7/1985 United Kingdom .
2186139  8/1987 United Kingdom .

Primary Examiner—David Mis
Attorney, Agent, or Firm—Marianne R. Rich; Emmanuel J. Lobato

[57] ABSTRACT

Phase detector having a first input for an angle-modulated input carrier to be detected, and a second input for a reference carrier having a phase shift which is dependent on the angle modulation with respect to the input carrier, the input and reference carriers being at least multiplied in the phase detector, and a frequency demodulator including such a phase detector. In order to inhibit signal distortion and notably second-order interference products in the demodulation of an angle-modulated input carrier, the phase detector according to the invention is adapted to derive an in-phase carrier A and a phase quadrature carrier B from the input carrier and to derive an in-phase carrier C and a phase quadrature carrier D from the reference carrier which has a phase which, at an average, is equal or opposite to that of the input carrier, while the phase detector is further adapted to supply from its output a signal which substantially corresponds to AC-BD.

6 Claims, 2 Drawing Sheets

PHASE DETECTOR AND FREQUENCY DEMODULATOR INCLUDING SUCH A PHASE DETECTOR

The invention relates to a phase detector having a first input for an angle-modulated input carrier to be detected, and a second input for a reference carrier having a phase shift which is dependent on the angle modulation with respect to the input carrier, the input and reference carriers being at least multiplied in the phase detector. The invention also relates to a frequency demodulator including such a phase detector.

A phase detector and frequency demodulator of this type are known, for example from U.S. Pat. No. 4,470,759.

The known phase detector actually comprises a simple multiplier circuit or mixer stage in which an angle-modulated, i.e. a phase or frequency-modulated input carrier is multiplied by a reference carrier which has the same central frequency as the input carrier but, at an average, is shifted 90° in phase with respect thereto. The phase detector supplies an output voltage which varies in dependence upon the phase difference deviating from 90° between the input carrier and the reference carrier. If the reference carrier is derived from the input signal via a frequency-dependent phase shifter, for example a delay element, the phase detector together with the frequency-dependent phase shifter constitutes a quadrature detector for frequency-modulated signals. This type of FM quadrature detector is notably used in FM radios, in video recorders (VCRs) and video players (VLPs). If the phase detector is incorporated in a phaselocked loop, via which the reference signal is derived from the input signal, the phase detector together with the other elements of the loop constitutes a PLL-FM/PM demodulator, also referred to as PLL frequency demodulator.

If the phase detector is used in an FM quadrature detector for FM demodulation, its signal-to-noise ratio may be improved by means of an improved frequency-phase conversion in the frequency-dependent phase shifter, for example when using a delay element by increasing the effective delay time for the input carrier. However, in practice there is a limit to this improvement due to the limited modulation index of the phase detector.

Moreover, not only the desired baseband modulation signal, but also a second-order interference product signal having a frequency which is twice the instantaneous frequency of the input carrier is produced in the multiplier of the known phase detector. This second-order interference product signal occurs both when multiplying sinusoidal carriers and when multiplying non-sinusoidal carriers, for example amplitude-limited or square-wave carriers which are often used for practical reasons. These interference product signals, and notably the non-harmonic distortion signals around twice the frequency of the carrier of the input signal, may be very impeditive in certain applications.

It is an object of the invention to increase the distortion-free range of the known phase detector in a simple manner with respect to the modulation index of the angle-modulated input signal and to inhibit second-order interference products when demodulating this input signal.

According to the invention, this is achieved in a phase detector of the type described in the opening paragraph in that the phase detector is adapted to derive an in-phase carrier A and a phase quadrature carrier B from the input carrier and to derive an in-phase carrier C and a phase quadrature carrier D from the reference carrier which has a phase which, at an average, is equal or opposite to that of the input carrier, and in that the phase detector is further adapted to supply from its output a signal which substantially corresponds to AC-BD.

Such a phase detector according to the invention may be used advantageously in a synchronous PLL-AM receiver because at an average the reference carrier is in phase or in anti-phase with the received carrier and ensures a synchronous detection of the input carrier without a further 90° phase shift as is required when using conventional phase detectors in PLL circuits.

A frequency demodulator according to the invention is characterized in that it includes the last-mentioned phase detector, and a frequency-dependent phase shifter for deriving the reference carrier from the input carrier, the reference carrier being, at an average, in phase or in anti-phase with respect to the input carrier.

The invention will now be described in greater detail with reference to some embodiments and the drawings in which corresponding elements are denoted by the same reference symbols.

Figures 1, 2:
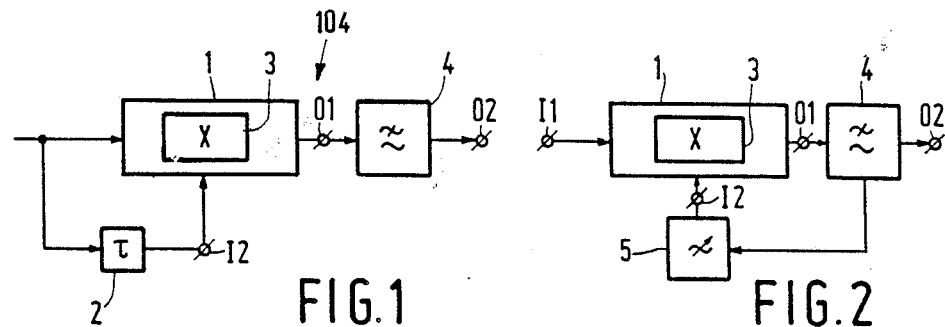
FIGS. 1 and 2 show diagrams of the use of the known phase detector in an FM quadrature demodulator and a PLL angle demodulator, respectively.

FIG. 1 shows the simplified diagram of a known quadrature demodulator 1–4 for FM signals in which the phase detector 1 comprises a multiplier 3 and has a first input I1 to which an FM input carrier is applied, a second input I2 to which a quadrature detection carrier is applied as a reference carrier which is derived from the FM input carrier via a delay circuit 2 and has a frequency-dependent phase shift relative thereto which is 90° at an average. In the multiplier 3 the FM input carrier is multiplied by the said reference carrier. The baseband frequency modulation signal of the FM input signal is obtained at an output 01 of the known phase detector 1, which signal is available for further signal processing at a signal output 02 of the quadrature demodulator 104 after a selection in a low-pass filter 4.

FIG. 2 shows the simplified diagram of a known PLL angle demodulator for FM/PM signals. Together with the low-pass filter 4 and a voltage-controlled oscillator 5, the known phase detector 1 is incorporated in a phase-locked loop (PLL). The voltage-controlled oscillator 5 applies a quadrature detection carrier as a reference carrier to the second input I2 of the phase detector 1, which carrier is derived from the FM/PM input carrier at the first input I1 via the operation of the loop and which, with respect thereto, has a phase shift of 90° at an average dependent on the angle modulation, i.e. on the phase or frequency modulation. The demodulated baseband angle modulation signal becomes available at the output 02 of the low-pass filter 4.

Figure 3:
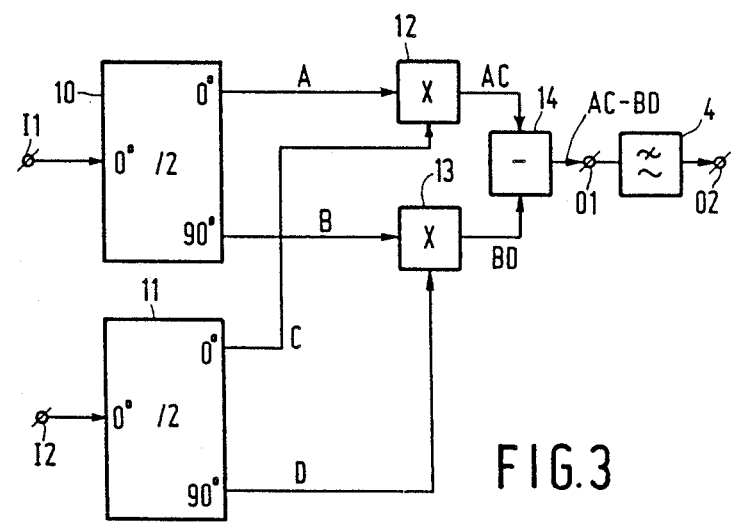
FIG. 3 shows diagrammatically an embodiment of the phase detector according to the invention.

FIG. 3 shows a first embodiment of a phase detector according to the invention. A phase-modulated input carrier is applied to the first input I1 and a reference carrier having a fixed frequency and phase which corresponds to the central frequency and which differs 190°, respectively, from the average phase of the input carrier is applied to the second input I2. The phase detector according to the invention comprises first and second divide-by-two frequency dividers 10 and 11 to which the phase-modulated input carrier and the last-mentioned reference carrier are applied via the first and second inputs I1 and I2, respectively. The divide-by-two frequency dividers 10 and 11 supply pairs of phase quadrature signals A and B, and C and D each having a frequency which is half that of the input carrier and the reference carrier, respectively.

In the absence of phase modulation the signals A and C, and the signals B and D are in a mutual phase relationship, or in other words, each of the signals A and C is in phase quadrature with each of the signals B and D. If there is a phase modulation on the input carrier, a phase difference dependent on the angle modulation is produced between the phase quadrature signal pair A, B on the one hand and the phase quadrature signal pair C, D on the other hand.

The phase detector also comprises a multiplier 12 and a further multiplier 13 to which the signals A and C and the signals B and D, respectively are applied. Output signals AC and BD of these multipliers are subsequently subtracted from each other in a subtractor stage 14, resulting in a signal AC-BD which yields the baseband phase modulation signal after a suitably chosen integration in a filter 4.

Figure 4:
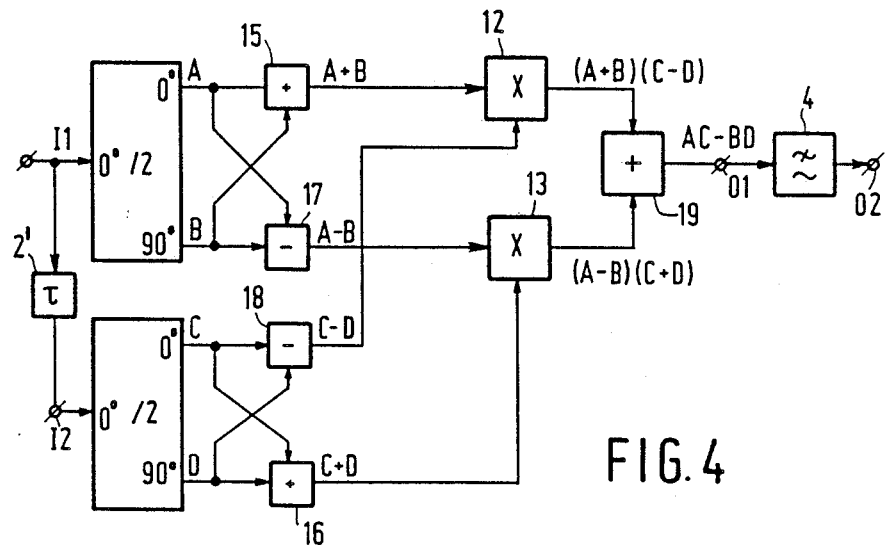
FIG. 4 shows diagrammatically a modification of the phase detector of FIG. 3, used in an FM demodulator.

FIG. 4 shows a modification of the phase detector of FIG. 3, used in an FM demodulator. The first input I1 is coupled to the second input I2 via a delay circuit 2,. A frequency-modulated (FM) input carrier is applied to the first input I1 and the reference carrier is applied to the second input I2, which reference carrier is derived from the FM input carrier via the delay circuit 2' and, at an average, is in phase or in anti-phase therewith by means of a suitably chosen delay value. The signal AC-BD is obtained in this modification by firstly forming the sum (A+B) of the signals A and B and the sum (C+D) of the signals C and D in first and second adder stages 15 and 16, respectively and the difference (A−B) of the signals A and B and the difference (C−D) of the signals C and D in first and second subtractor stages 17 and 18, respectively. Subsequently, the sum signal (A+B) is multiplied by the difference signal (C−D) in the multiplier 12 resulting in a signal (A+B) (C−D) and the difference signal (A−B) is multiplied by the sum signal (C+D) in the multiplier 13 resulting in a signal (A−B) (C+D). By adding the signals (A+B) (C−D) and (A−B) (C+D) in an adder stage 19, the above-mentioned signal AC-BD is obtained from which the baseband frequency modulation signal becomes available via the filter 4 for a further signal processing.

It is evident that the phase detector of FIG. 3 can be used in a corresponding manner in an FM demodulator by incorporating a delay circuit corresponding to the delay circuit 2, between the inputs I1 and I2 (not shown) so that the reference carrier is also derived from the input carrier and, at an average, is in phase or in anti-phase therewith.

The frequency modulation-dependent phase shift of the reference carrier required for the correct operation of the phase detectors according to the invention in an FM demodulator, which phase shift is at an average 180° and 360°, respectively, relative to the frequency-modulated input carrier, is realized in the embodiment shown in FIG. 4 by means of a suitably chosen signal delay in the delay circuit 2', which is substantially twice as large and four times as large, respectively, as that of the delay circuit 2 of the known FM quadrature demodulator of FIG. 1.

A modification of this phase shift mode is possible by using the phase detectors according to the invention in a phase-locked loop (not shown) analogous to the use of conventional phase detectors in the conventionally known PLL-FM/PM demodulator of FIG. 2. In contrast to the phase detector of the known PLL-FM/PM demodulator a reference carrier is applied to the second input I2 of the phase detector according to the invention, which reference carrier is, at an average, in phase or in anti-phase with an FM/PM input carrier at the first input I1.

Such a phase-locked loop is also particularly suitable for generating a local mixing carrier for a synchronous AM detection because the reference carrier is in phase or in anti-phase with the now AM-modulated input carrier and can be used as a local mixing carrier for a synchronous demodulation of the AM modulation signal without a further 90° phase shift as is required in conventional AM PLL receivers.

Figure 5:
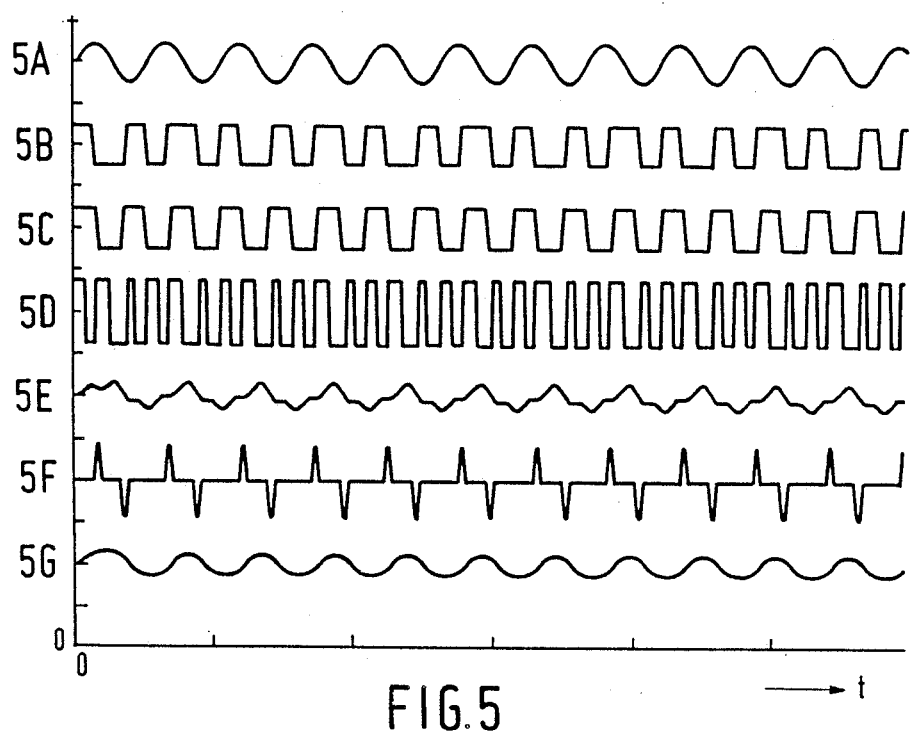
FIGS. 5 and 6 show some graphs to explain the operation of the phase detector of FIG. 3 at a modulation index of 0.5 and 3.0, respectively.

For the purpose of comparison FIG. 5 shows some graphs of the known phase detector and of the novel phase detector as shown in FIG. 3 for a modulation index of 0.5 of the signal applied to the input. Graph 5A shows the phase modulation signal as a function of time, graph 5B shows the amplitude-limited phase-modulated input signal and graph 5C shows the amplitude-limited reference signal. It can clearly be seen that the frequency of the modulation signal is comparatively high as compared with the carrier frequency of the input signal. This may be required, for example in video recorders or video players in order to record or read information with a high packing density, for example in FM receivers using swing compression so as to render a realizable integration possible and, for example in wireless telephone devices so as to comply with legal prescriptions. This also means that the unfiltered output signals of the phase detector comprise interference signals having a frequency around twice the carrier frequency, which interference signals are not negligible.

Due to the multiplication of the two in-phase carriers A and C and the multiplication of the two phase quadrature carriers B and D and the subsequent subtraction of the product signals AC and BD, pulses having an alternating polarity are produced due to phase differences between the input carrier (for example, an intermediate frequency carrier) and reference carriers as a result of the modulation signal, so that the said second-order interference signals are considerably reduced.

Graph 5D shows the output signal of the known phase detector and graph 5F shows the output signal of the novel phase detector. A comparison of these two signals shows that it is evident that the total quantity of interference signals in the novel phase detector is considerably reduced. This of course also applies to the output signals, obtained after filtering, of the two phase detectors, which signals are shown in the graphs 5E and 5G, respectively.

Figure 6:
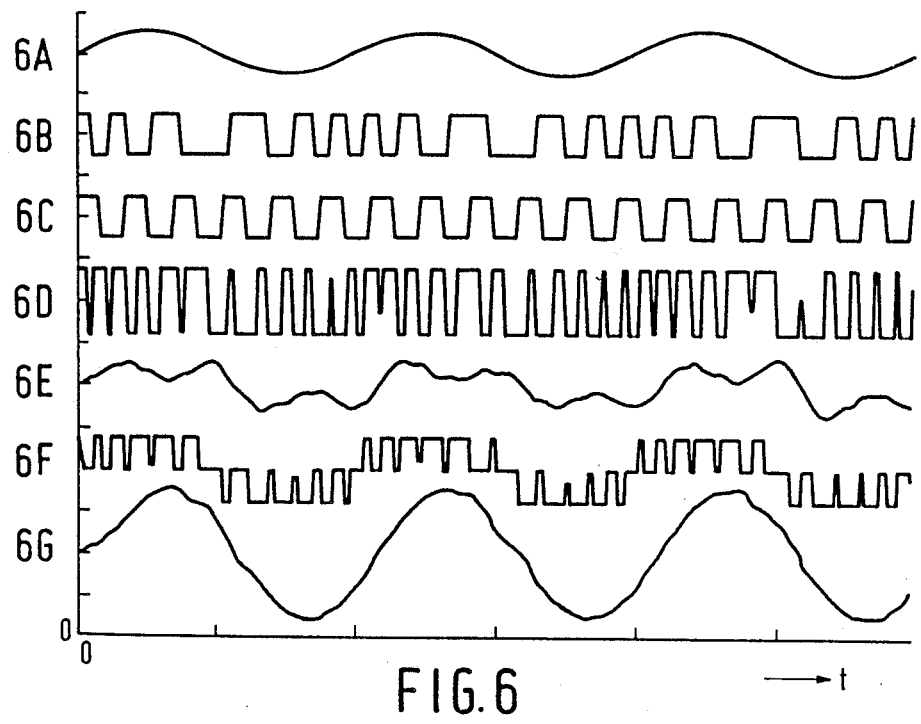

FIG. 6 shows graphs of corresponding signals in the case of a larger modulation index of 3.0 of the input signal. Here again a comparison of the graphs 6E and 6G of the output signals of the known and the novel phase detector shows that the quantity of spurious or interference signals is considerably reduced in the novel phase detector.

The difference in harmonic distortion in the output signal of the known and of the novel phase detector is also of great importance, as is also apparent from a comparison of the graphs 5E and 5G, and 6E and 6G, respectively.

I claim:

1. A phase detector having a first input for an angle-modulated input carrier to be detected, and a second input for a reference carrier having a phase shift which is dependent on the angle modulation with respect to the input carrier, the input and reference carriers being at least multiplied in the phase detector, characterized in that the phase detector is adapted to derive an in-phase carrier A and a phase quadrature carrier B from the input carrier and to derive an in-phase carrier C and a phase quadrature carrier D from the reference carrier which has a phase which, at an average, is equal or opposite to that of the input carrier, and in that the phase detector is further adapted to supply from its output a signal which substantially corresponds to AC-BD.

2. A phase detector as claimed in claim 1, characterized in that the input carrier and the reference carrier are applied to a first and a second divide-by-two frequency divider, respectively, the carriers A and B being taken from a pair of phase quadrature outputs of the first divide-by-two frequency divider and the carriers C and D being taken from a pair of phase quadrature outputs of the second divide-by-two frequency divider.

3. A phase detector as claimed in claim 1, which comprises at least a multiplier, characterized in that a further multiplier is provided in which the carriers A and C are applied to the one multiplier and the carriers B and D are applied to the further multiplier, and in that the output signals AC and BD from the one and the further multiplier are applied to a subtractor stage.

4. A phase detector as claimed in claim 1, characterized by means for deriving signals from the carriers A and B and from the carriers C and D, which signals correspond to A+B and A −B, and to C+D and C−D, respectively and for deriving therefrom two product signals which correspond to (A+B).(C−D) and (A−B).(C+D), respectively, which product signals are subtracted from each other.

5. A phase detector as claimed in claim 4, comprising at least a multiplier, characterized in that the input carrier and the reference carrier are applied to a first and a second divide-by-two frequency divider, respectively, both a first adder stage and a first subtractor stage being connected to the two phase quadrature outputs of the first divide-by-two frequency divider and both a second adder stage and a second subtractor stage being connected to the two phase quadrature outputs of the second divide-by-two frequency divider, and in that the output signals A+B and C−D are applied from the first adder stage and the second subtractor stage to the one multiplier and in that the output signals A−B and C+D are applied from the first subtractor stage and the second adder stage to a further multiplier, respectively, the output signals of the two multipliers being applied to an adder stage.

6. A frequency demodulator, characterized in that it includes a phase detector as claimed in claim 1 and a frequency-dependent phase shifter for deriving the reference carrier from the input carrier, the reference carrier being at an average in phase or in anti-phase with respect to the input carrier.

* * * * *